(12) United States Patent
Shin et al.

(10) Patent No.: US 10,269,653 B2
(45) Date of Patent: *Apr. 23, 2019

(54) METHOD OF FABRICATING DMOS AND CMOS TRANSISTORS

(71) Applicant: Magnachip Semiconductor, Ltd., Cheongju-si (KR)

(72) Inventors: Hyun Kwang Shin, Cheongju-si (KR); Jung Lee, Cheongju-si (KR); Kyung Ho Lee, Cheongwon-gun (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/831,897

(22) Filed: Dec. 5, 2017

(65) Prior Publication Data

US 2018/0096897 A1    Apr. 5, 2018

Related U.S. Application Data

(63) Continuation of application No. 15/408,200, filed on Jan. 17, 2017, now Pat. No. 9,859,168.

(30) Foreign Application Priority Data

Sep. 13, 2016  (KR) .................. 10-2016-0118251

(51) Int. Cl.
  *H01L 27/092*  (2006.01)
  *H01L 21/8238*  (2006.01)
  *H01L 29/78*  (2006.01)

(52) U.S. Cl.
  CPC ............... *H01L 21/823814* (2013.01); *H01L 21/823892* (2013.01); *H01L 27/0922* (2013.01); *H01L 21/823807* (2013.01); *H01L 29/78* (2013.01); *H01L 29/7816* (2013.01)

(58) Field of Classification Search
  None
  See application file for complete search history.

(56) References Cited

U.S. PATENT DOCUMENTS

| | | | |
|---|---|---|---|
| 6,686,233 B2 | 2/2004 | Soderbarg et al. |
| 7,205,630 B2 | 4/2007 | Chang et al. |
| 7,211,863 B2 | 5/2007 | Williams et al. |
| 7,329,570 B2 | 2/2008 | Lee |
| 8,138,049 B2 | 3/2012 | You |

(Continued)

*Primary Examiner* — Asok K Sarkar
(74) *Attorney, Agent, or Firm* — NSIP Law

(57) ABSTRACT

A method of fabricating a semiconductor device including a diffused metal-oxide-semiconductor (DMOS) transistor, an n-type metal-oxide-semiconductor (NMOS) transistor, and a p-type metal-oxide-semiconductor (PMOS) transistor includes forming separation regions in a semiconductor substrate, forming a gate insulating film, forming a DMOS gate electrode on the gate insulating film, forming a first mask pattern on the semiconductor substrate, performing a first ion implantation process, forming a second mask pattern on the semiconductor substrate, performing a second ion implantation process, forming a third mask pattern on the semiconductor substrate and performing a third ion implantation process into the semiconductor substrate, and forming a fourth mask pattern on the semiconductor substrate and performing a fourth ion implantation process.

8 Claims, 13 Drawing Sheets

(56) References Cited

U.S. PATENT DOCUMENTS

| | | |
|---|---|---|
| 8,716,795 B2 | 5/2014 | You |
| 9,859,168 B1 * | 1/2018 | Shin .................. H01L 21/82381 |
| 2006/0099764 A1 | 5/2006 | Zuniga et al. |
| 2014/0048876 A1 | 2/2014 | Sekiguchi |

* cited by examiner

METHOD OF FABRICATING DMOS AND CMOS TRANSISTORS

CROSS-REFERENCE TO RELATED APPLICATIONS

This application is a continuation of U.S. application Ser. No. 15/408,200 filed on Jan. 17, 2017 now U.S. Pat. No. 9,859,168 issued on Jan. 2, 2018, which claims the benefit under 35 USC 119(a) of Korean Patent Application No. 10-2016-0118251, filed on Sep. 13, 2016 in the Korean Intellectual Property Office, the entire disclosures of which are incorporated herein by reference for all purposes.

BACKGROUND

1. Field

The following description relates to a semiconductor fabrication process. The following description also relates to a fabrication process of a diffused metal-oxide-semiconductor (DMOS) transistor and a complementary metal-oxide-semiconductor (CMOS) transistor.

2. Description of Related Art

Modern integrated circuit (IC) devices include a large number of metal-oxide-semiconductor (MOS) transistors that are wired together to form multiple circuits for implementing a variety of functions. MOS transistor ICs may generally be categorized into low-voltage circuits having an operating voltage of less than about 6V and high-voltage circuits having an operating voltage of about 30V or more. Examples of the low-voltage circuits may include complementary metal-oxide-semiconductor (CMOS) transistor circuits, mainly used in applications such as logic circuits, controllers, drivers, and the like. Examples of the high-voltage circuits may include double-diffused metal-oxide-semiconductor (DMOS) transistor circuits, mainly used for switching regulators and the like. There is an important difference between the two types of transistor circuits. As compared to the low-voltage circuits, the high-voltage circuits are required to withstand a high induced electric field, such that avalanche breakdown, that is, punch-through, does not occur in the channel region between the source and drain. Thus, these two types of transistor circuits differ substantially in terms of transistor parameters and structure.

Recently, it has become possible to integrate a DMOS transistor, which is an example of a high-voltage power MOS transistor device, and a CMOS transistor, which is an example of a low-voltage MOS transistor device, into a single IC chip due to the introduction of an advanced bipolar-CMOS-DMOS (BCD) process. Combining and integrating the DMOS transistor and the CMOS transistor together into a single IC chip in this manner provides the advantages that diversity in design and improved performance and reliability may be attained. Furthermore, the overall system manufacturing costs can be reduced. However, there are disadvantages associated with integrating the DMOS transistor and the CMOS transistor into a single IC chip, that is, it still involves going through a manufacturing process as complicated as other approaches and still leads to high manufacturing costs. To overcome those disadvantages, studies for simplifying a BCD process required to integrate a DMOS transistor and a CMOS transistor into a single IC chip are being vigorously carried out in the related semiconductor industrial technology fields.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of fabricating a semiconductor device including a diffused metal-oxide-semiconductor (DMOS) transistor, an n-type metal-oxide-semiconductor (NMOS) transistor, and a p-type metal-oxide-semiconductor (PMOS) transistor includes forming separation regions in a semiconductor substrate, the separation regions isolating a DMOS transistor area in which to form the DMOS transistor, an NMOS transistor area in which to form the NMOS transistor, and a PMOS transistor area in which to form the PMOS transistor from one another, and the DMOS transistor area including a source zone and a drain zone, forming a gate insulating film between the source zone and the drain zone, forming a DMOS gate electrode on the gate insulating film, forming a first mask pattern on the semiconductor substrate to expose the drain zone and a second portion of the DMOS gate electrode adjacent to the drain zone, performing a first ion implantation process into the exposed second portion of the DMOS gate electrode and the semiconductor substrate to form n-type well (NWELL) regions in the drain zone and the PMOS transistor area, respectively, forming a second mask pattern on the semiconductor substrate to expose the source zone and a first portion of the DMOS gate electrode adjacent to the source zone, performing a second ion implantation process into the exposed first portion of the DMOS gate electrode and the semiconductor substrate to form p-type well (PWELL) regions in the source zone and the NMOS transistor area, respectively, forming a third mask pattern on the semiconductor substrate and performing a third ion implantation process into the semiconductor substrate to form a high concentration drain region and a high concentration source region in the NWELL region in the drain zone and the PWELL region in the source zone, respectively, and forming a fourth mask pattern on the semiconductor substrate and performing a fourth ion implantation process into the semiconductor substrate to form a well tab region in the PWELL region in the DMOS transistor area.

The separation regions may be formed using a shallow trench isolation (STI) process, local oxidation of silicon (LOCOS), or a deep trench isolation (DTI) process.

The separations regions may be formed by using a shallow trench isolation (STI) process to form STI structures and the STI structures are formed using any one or any combination of two or more of high density plasma chemical vapor deposition (HDPCVD) using a silicon oxide film ($SiO_2$), low pressure chemical vapor deposition (LPCVD), tetra-ethyl-orthosilicate (TEOS) deposition, and plasma enhanced chemical vapor deposition, chemical mechanical polishing, and a cleaning process.

The semiconductor substrate may be formed of any one of or any combination of two or more of silicon, gallium arsenide (GaAs), and silicon germanium (SiGe), or a silicon-on-insulator (SOI) wafer, or an epitaxial layer.

The method may further include, after the forming separation regions in the semiconductor substrate and before the performing a second ion implantation process into the exposed first portion of the DMOS gate electrode and the semiconductor substrate, forming an NMOS gate electrode in the NMOS transistor area.

The performing a first ion implantation process into the exposed second portion of the DMOS gate electrode and the semiconductor substrate may include forming a p-type lightly doped drain (PLDD) region in the NWELL region in the PMOS transistor area, and the performing a second ion implantation process into the exposed first portion of the DMOS gate electrode and the semiconductor substrate may include forming an n-type lightly doped drain (NLDD) region in the PWELL region in the NMOS transistor area.

The forming a third mask pattern on the semiconductor substrate and performing a third ion implantation process into the semiconductor substrate may include forming n-type source and drain (NSD) regions in the PWELL region in the NMOS transistor region, and the forming a fourth mask pattern on the semiconductor substrate and performing a fourth ion implantation process into the semiconductor substrate may include forming p-type source and drain (PSD) regions in the NWELL region in the PMOS transistor region.

The performing a first ion implantation process into the exposed second portion of the DMOS gate electrode and the semiconductor substrate may include performing the first ion implantation process such that the NWELL region in the drain zone is formed to be deeper than the high concentration drain region and is formed to be shallower below the DMOS gate electrode than below the high concentration drain region, and the performing a second ion implantation process into the exposed first portion of the DMOS gate electrode and the semiconductor substrate may include performing the second ion implantation process such that the PWELL region in the source zone is formed to be deeper than the high concentration source region and is formed to be shallower below the DMOS gate electrode than below the high concentration source region.

The method may further include preparing the semiconductor substrate.

The preparing the semiconductor substrate may include forming an n-type buried layer (NBL) in the semiconductor substrate, forming an epitaxial layer on the NBL, and forming a high voltage (HV) well region in a partial area of the epitaxial layer.

The preparing the semiconductor substrate may include forming at least one device separation region, and the at least one device separation region may include a deep trench isolation (DTI) formed deeper than the NBL.

The forming separation regions in the semiconductor substrate may include forming a trench type drain insulating film below the DMOS gate electrode and forming a source insulating film between the well tab region and the high concentration source region.

The performing a second ion implantation process into the exposed first portion of the DMOS gate electrode and the semiconductor substrate may include forming the PWELL region in the source zone such that the PWELL region in the source zone abuts the NWELL region in the drain zone below the DMOS gate electrode, and the NWELL region in the drain zone and the PWELL region in the source zone may serve as a drift region and a p-body region, respectively.

In another general aspect, a method of forming a diffused metal-oxide-semiconductor (DMOS) device in a semiconductor substrate having a drain zone and a source zone includes forming a gate insulating film on the semiconductor substrate, forming a gate electrode on the gate insulating film, forming a first mask pattern on the semiconductor substrate to have a first portion of the gate electrode adjacent the source zone masked and have a second portion of the gate electrode adjacent the drain zone exposed, performing a first ion implantation process into the exposed second portion of the gate electrode and the semiconductor substrate to form an n-type well (NWELL) region overlapping at least in part with the second portion of the gate electrode in the drain zone, forming a second mask pattern on the semiconductor substrate to have a second portion of the gate electrode adjacent the drain zone masked and have a first portion of the gate electrode adjacent the source zone exposed, performing a second ion implantation process into the exposed first portion of the gate electrode and the semiconductor substrate to form a p-type well (PWELL) region overlapping at least in part with the first portion of the gate electrode in the source zone, forming sidewall spacers at sidewalls of the gate electrode, respectively, forming a third mask pattern on the semiconductor substrate and performing a third ion implantation process into the semiconductor substrate to form a high concentration source region and a high concentration drain region in the PWELL region and the NWELL region, respectively, and forming a fourth mask pattern on the semiconductor substrate and performing a fourth ion implantation process into the semiconductor substrate to form a high concentration well tab region in the PWELL region.

The performing a first ion implantation process into the exposed second portion of the gate electrode and the semiconductor substrate may include forming the NWELL region such that the NWELL region is formed deeper than the high concentration drain region and is formed shallower below the gate electrode than below the high concentration drain region, and the performing a second ion implantation process into the exposed first portion of the gate electrode and the semiconductor substrate may include forming the PWELL region such that the PWELL region is formed deeper than the high concentration source region and is formed shallower below the gate electrode than below the high concentration source region.

The method may further include, before the forming a gate insulating film on the semiconductor substrate, forming separation regions in the semiconductor substrate, and the forming the separation regions in the semiconductor substrate may include forming a trench type drain insulating film below the gate electrode and forming a source insulating film between the well tab region and the high concentration source region.

The method may further include, before the forming a gate insulating film on the semiconductor substrate, preparing the semiconductor substrate, and the preparing the semiconductor substrate may include forming an n-type buried layer (NBL) in the semiconductor substrate, forming an epitaxial layer on the NBL, and forming a high voltage (HV) well region in a partial area of the epitaxial layer.

The performing a second ion implantation process into the exposed first portion of the gate electrode and the semiconductor substrate may include forming an n-type lightly doped drain (NLDD) region in the PWELL region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
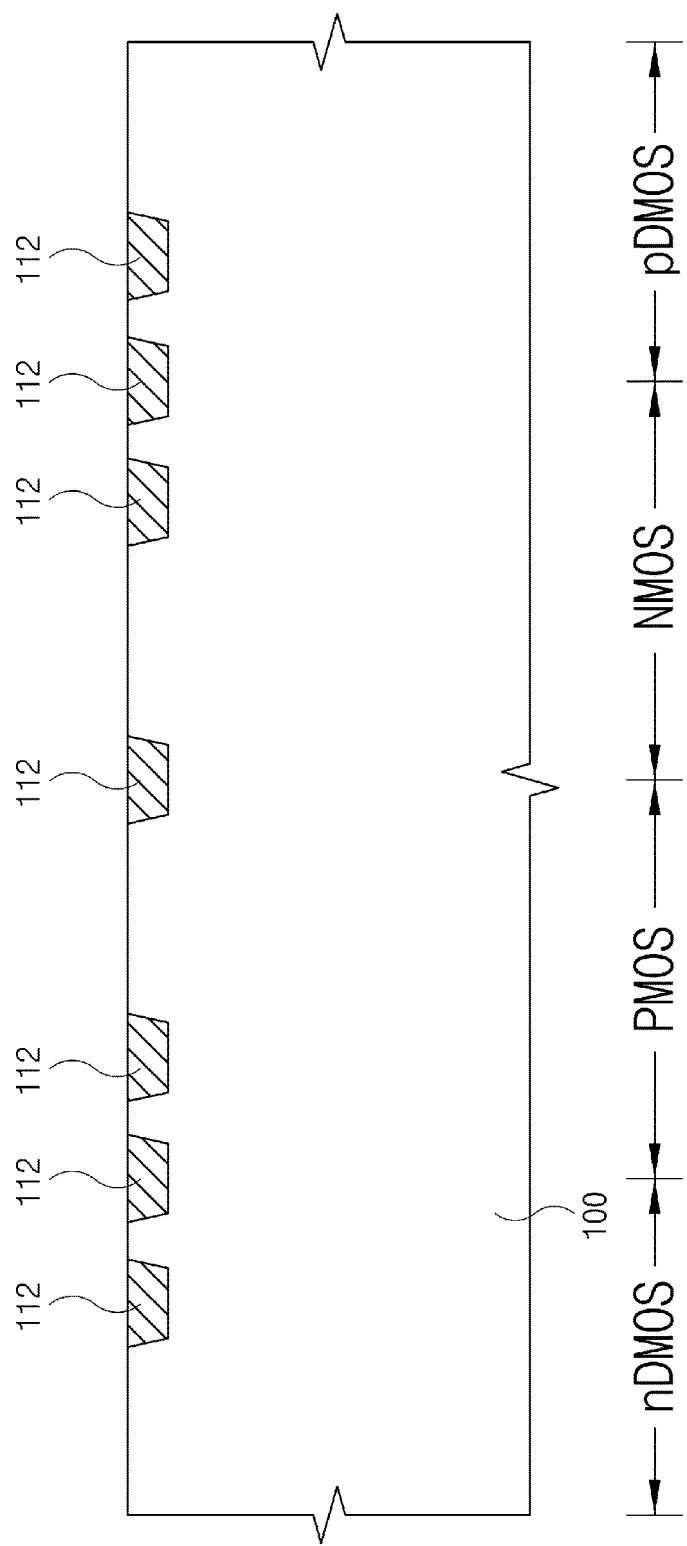
FIG. 1 shows a cross-sectional view of an example of a semiconductor substrate in which separation regions are formed.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

In this disclosure, various examples and implementations are described in further detail to provide a method of fabricating a semiconductor device including a diffused metal-oxide-semiconductor (DMOS) transistor and a complementary metal-oxide-semiconductor (CMOS) transistor. Reference is now made in further detail to the embodiments, examples of which are illustrated in the accompanying drawings. The features and advantages of the disclosed technology will become more apparent by referring to the embodiments thereof given in conjunction with the attached drawings. However, the disclosed technology is not limited to the embodiments described below but may be materialized in various different ways. Like reference numerals refer to like elements throughout.

As used herein, all terminologies, including technical and scientific terms, are be defined by definitions commonly shared by those skilled in the art to which the disclosed technology pertains unless a different definition is provided. Also, general terms and phrases whose definitions are provided in a common dictionary are not to be interpreted out of the common understanding unless another definition is explicitly provided.

Advantages and features of the disclosed technology and methods of accomplishing them are to be made apparent by referencing the embodiments which are described in detail in conjunction with the accompanying drawings. However, the disclosed technology is not limited to the embodiments set forth herein and may be embodied in different forms, the present embodiments are only provided so that the disclosure of the disclosed technology is complete so that one of ordinary skill in the art may understand the full scope of the disclosed technology, and the disclosed technology is only to be defined by the appended claims.

Examples of the disclosed technology are described in further detail below with reference to the appended drawings. However, in the following descriptions, in case a description of a known function or configuration is likely to unnecessarily obscure the subject matter of the disclosed technology, such a description of the known function or configuration will be omitted.

Examples of the disclosed technology are directed to providing a semiconductor device fabrication method that lends itself to integration of DMOS and CMOS transistors into a single integrated circuit chip while using a smaller number of mask patterns compared to a conventional technology and/or providing an improved DMOS fabrication process that employs a smaller number of mask patterns, as compared to a conventional DMOS process.

FIGS. 1 to 8 are drawings for explaining an example of a method of fabricating a semiconductor device including DMOS and CMOS transistors. Elements illustrated in the drawings are merely illustrated in sizes relative to those of other elements for convenience, and it should be understood that actual sizes of the elements may be substantially different from those illustrated in the drawings.

FIG. 1 shows a cross-sectional view of an example of a semiconductor substrate in which separation regions are formed. For example, a semiconductor substrate 100 may include substrates formed with materials such as silicon, gallium arsenide (GaAs), and silicon germanium (SiGe), or a silicon-on-insulator (SOI) wafer, an epitaxial layer, or other semiconductor layers that are formed based on these substrates. In the example of FIG. 1, a separation region 112 separates an n-type DMOS transistor (nDMOS transistor) area, a p-type metal-oxide-semiconductor (PMOS) transistor area, an n-type metal-oxide-semiconductor (NMOS) transistor area, and a p-type DMOS transistor (pDMOS transistor) area from one another to prevent unnecessary leakage current from flowing between these transistor areas. In an example, the separation region 112 is a shallow trench isolation (STI) including a silicon trench, a trench liner oxide layer, and an oxide layer. However, it is to be appreciated that a structure for the separation region 112 is not limited to such an STI. In another example, the separation region 112 is formed using a local oxidation of silicon (LOCOS) process or a deep trench isolation (DTI) process. If the separation region 112 is formed using the STI structure, an etching process, a deposition process such as high density plasma chemical vapor deposition (HDPCVD) using a silicon oxide film ($SiO_2$), low pressure chemical vapor deposition (LPCVD), tetraethyl-orthosilicate (TEOS) deposition, and plasma enhanced chemical vapor deposition, chemical mechanical polishing, and a cleaning process may be used, to form the STI structure, according to conventional approaches. However, it is also to be appreciated that various materials other than the silicon oxide film ($SiO_2$) may be used as a trench filling material for the separation region 112.

Figure 2:
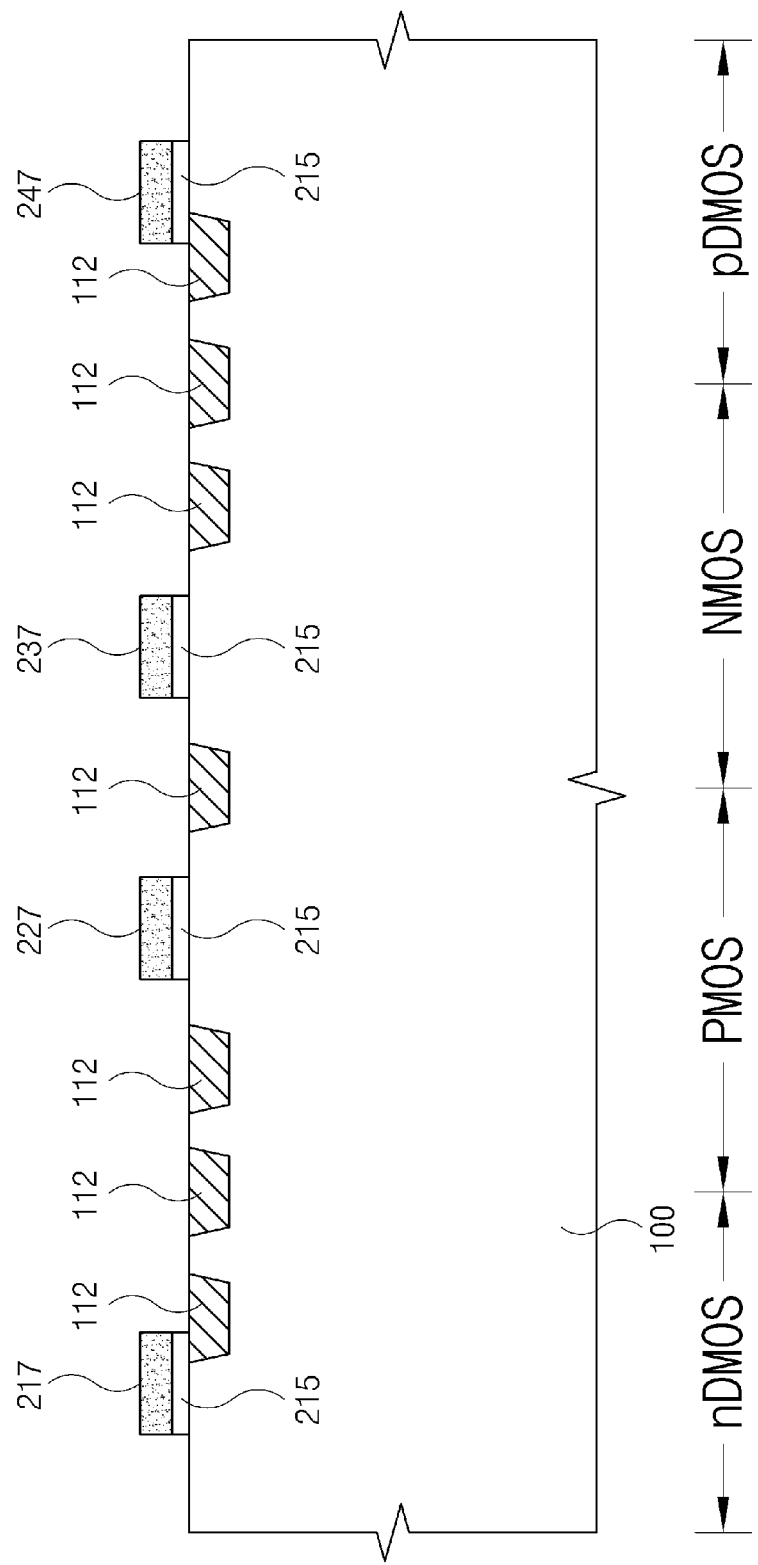
FIG. 2 shows a cross-sectional view of an example of a semiconductor substrate in which a stack consisting of a gate insulating film and a gate electrode is formed in each of an nDMOS transistor area, a PMOS transistor area, an NMOS transistor area, and a pDMOS transistor area.

FIG. 2 shows a cross-sectional view of an example of a semiconductor substrate in which a stack including a gate insulating film and a gate electrode is formed in each of an nDMOS transistor area, a PMOS transistor area, an NMOS transistor area, and a pDMOS transistor area. In the example of FIG. 2, a gate insulating film 215 is formed of a gate dielectric material such as a silicon oxide film, which is referred to as a "gate oxide film" or a high-k dielectric material. The high-k refers to the dielectric constant of the material, which is a quantity measuring the ability of a substance to store electrical energy in an electric field. For example, the gate insulating film 215 formed in each of the PMOS transistor area and NMOS transistor area is formed using a thin gate insulating film for low voltage (LV) operation or a thick gate insulating film for medium voltage (MV) operation, according to a desired operating voltage of a CMOS transistor. In the example of FIG. 2, gate electrodes 217, 227, 237, and 247 are respectively formed on the gate insulating films 215, as illustrated. Subsequently, for convenience of description, the gate electrodes formed in each of the nDMOS transistor area, the PMOS transistor area, the NMOS transistor area, and the pDMOS transistor area are collectively referred to as "gate electrodes 217, 227, 237, and 247" or a "gate electrode 217, 227, 237, or 247." The gate electrodes 217, 227, 237, and 247 are respectively referred to as an nDMOS gate electrode 217, a PMOS gate electrode 227, an NMOS gate electrode 237, and a pDMOS gate electrode 247. For example, a stack including the gate insulating film 215 and one of the gate electrodes 217, 227, 237, or 247 is formed by forming the gate insulating film 215 by performing an oxidation process on the semiconductor substrate 100, laminating a conductive film such as a polysilicon film on the formed gate insulating film using one of the above-described deposition processes, and performing a patterning process such as by providing an exposure to light and etching the laminated conductive film and gate insulating film.

Figure 3:
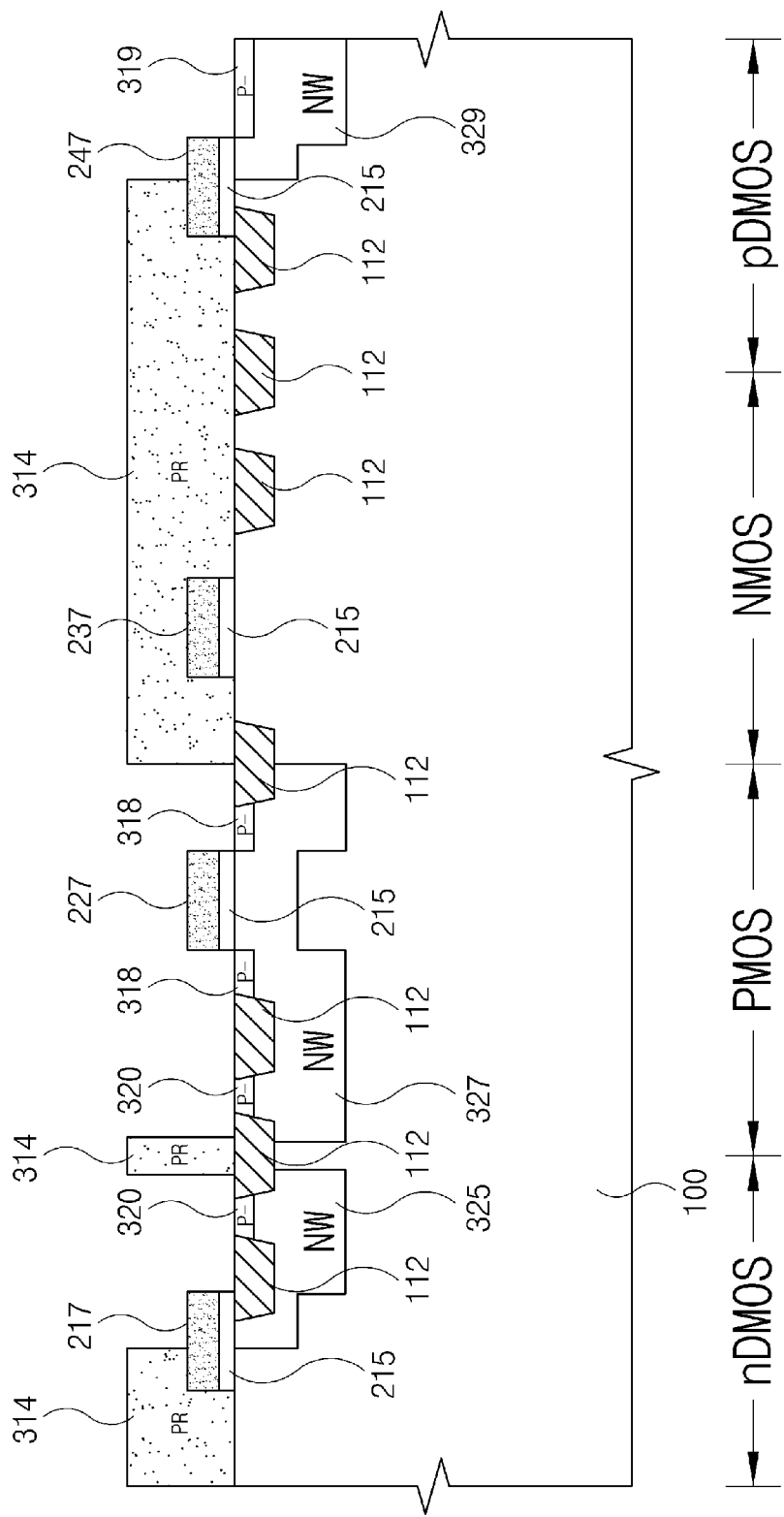
FIG. 3 shows a cross-sectional view of an example of a semiconductor substrate in which a first mask pattern is formed to expose a drain zone in an nDMOS transistor area, a PMOS transistor area, and a source zone in a pDMOS transistor area.

FIG. 3 shows a cross-sectional view of an example of a semiconductor substrate in which a first mask pattern is formed to expose a drain zone in an nDMOS transistor area, a PMOS transistor area, and a source zone in a pDMOS transistor area. For example, a first mask pattern 314 is formed using a known photolithography process to cover a source zone in the nDMOS transistor area, a portion of the separation region 112, which separates the nDMOS transistor area from the PMOS transistor area, the NMOS transistor area, and a drain zone in the pDMOS transistor area, as illustrated. Once the first mask pattern 314 is formed on the semiconductor substrate 100, a drain zone in the nDMOS transistor area, a second portion of the nDMOS gate electrode 217 adjacent the drain zone in the nDMOS transistor area, the PMOS transistor area, the PMOS gate electrode 227 in the PMOS transistor area, a source zone in the pDMOS transistor area, and a second portion of the pDMOS gate electrode 247 adjacent the source zone in the pDMOS transistor area may be exposed, as these areas are not covered by the first mask pattern 314.

In the example of FIG. 3, after the first mask pattern 314 is formed, an ion implantation process is performed to form n-type well (NWELL) regions 325, 327, and 329 in the drain zone in the nDMOS transistor area, the PMOS transistor area, and the source zone in the pDMOS transistor area, respectively. In such an example, the ion implantation is performed through the second portion of the nDMOS gate electrode 217 adjacent the drain zone in the nDMOS transistor area, the PMOS gate electrode 227 in the PMOS transistor area, and the second portion of the pDMOS gate electrode 247 adjacent to the source zone in the pDMOS transistor area, as well as the surface of the semiconductor substrate 100 in each exposed area. As illustrated in the example of FIG. 3, the NWELL regions 325, 327, and 329 in the form of a retrograde well are formed to be deeper than the separation regions 112 and/or high concentration source/drain regions. Such high concentration source/drain regions are formed in a subsequent process, by high-energy and medium-energy ion implantations. For example, the NWELL region 325 is formed deeper than the trench type drain insulating film, which is the separation region 112 below the nDMOS gate electrode 217, and a high concentration drain region, which is formed in the subsequent process. As another example, the NWELL region 329 is formed deeper than a high concentration source region, which is formed in the subsequent process.

Since the ion implantation process is performed using the at least partially exposed gate electrodes, the formed NWELL regions 325, 327, and 329 are shallower in areas below the respective gate electrodes 217, 227, and 247 than in areas below the separation regions 112 or high concentration source/drain regions, which are formed in the subsequent process. For example, in FIG. 3, the NWELL regions 325 and 329, which are formed to overlap with the second portion of the nDMOS gate electrode 217 and the second portion of the pDMOS gate electrode 247, respectively, are shallower below the nDMOS gate electrode 217 and the pDMOS gate electrode 247 than below the high concentration drain region and the high concentration source region, respectively. The configuration occurs because the ion implantation depth is reduced by the exposed second portion of the nDMOS gate electrode 217 and the exposed second portion of the pDMOS gate electrode 247, which act as masks during the ion implantation process. Also, in the example of FIG. 3, the NWELL region 325 formed in the nDMOS transistor area and the NWELL region 329 formed in the pDMOS transistor area serve as a drift region in the nDMOS transistor and an n-body region in the pDMOS transistor, respectively.

In an example, after performing the ion implantation to form the NWELL regions 325, 327, and 329, an n-type ion implantation process is performed to form a PMOS threshold voltage (Vt) adjustment area in an upper portion of the NWELL region 327 that is adjacent to the PMOS gate electrode 227. In such an example, the PMOS threshold voltage (Vt) adjustment area is formed at the surface of the semiconductor substrate 100 below the gate insulating film 215. Because the n-type threshold voltage adjustment area and the NWELL region 327 are formed to have the same conductivity type, the n-type ion implantation for threshold voltage adjustment is potentially performed immediately after the ion implantation for forming the NWELL regions 325, 327, and 329. In such an example, because the ion implantation for forming the PMOS threshold voltage (Vt) adjustment area is to be performed through the PMOS gate electrode 227, an ion implantation energy level is required to be controlled in consideration of a thickness of the PMOS gate electrode 227. In the present example, the ion implantation energy level is set higher than in the example in which ion implantation is performed in the absence of the PMOS gate electrode 227.

Subsequently, a p-type lightly doped drain (PLDD) ion implantation process is performed using p-type dopants to form PLDD regions 318 and 319 in the NWELL region 327 in the PMOS transistor area and the NWELL region 329 in the pDMOS transistor area, respectively. A pair of PLDD regions 318 is formed in a portion of the semiconductor substrate 100 that is exposed on both sides of the PMOS gate electrode 227. In such an example, tilted ion implantation is performed using n-type dopants to form an n-type Halo region or pocket region near the PLDD regions 318. Thus, ion implantation is carried out into the peripheries of the PLDD regions 318 using the tilted ion implantation. The n-type Halo region is required to prevent punch-through in the source-drain region. Alternatively put, the presence of an n-type Halo region is required to prevent a channel region from disappearing as depletion regions at the source-drain region gradually extend and merge at their ends. As illustrated, the PLDD ion implantation also allows p-type ion implantation to be formed into portions of the NWELL region 325 in the nDMOS transistor area and the NWELL region 327 in the PMOS transistor area, where well tab regions will be formed. Thus, conductive regions 320 of the p-conductivity type are formed in the corresponding portions below the surface of the semiconductor substrate 100.

Figure 4:
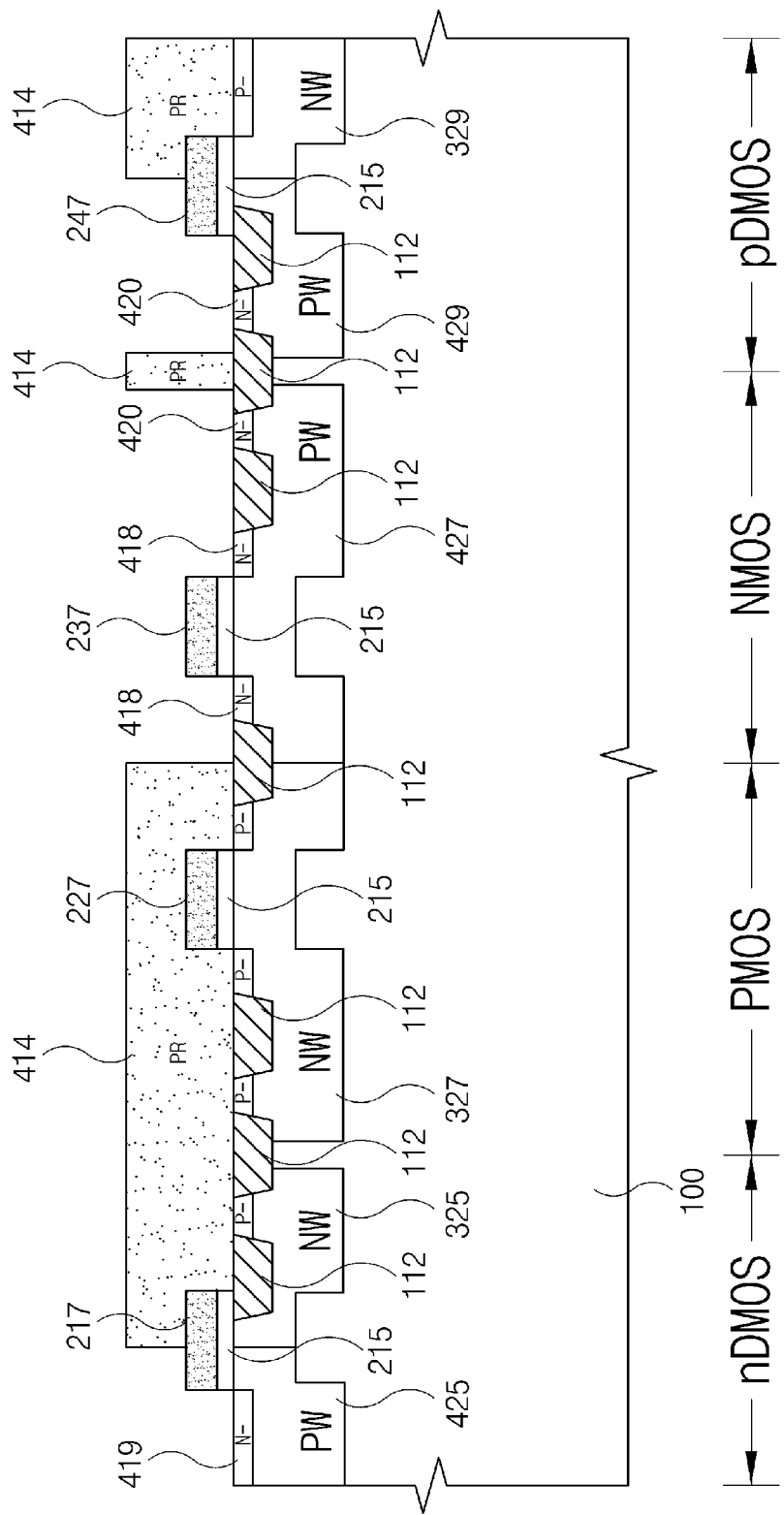
FIG. 4 shows a cross-sectional view of an example of a semiconductor substrate in which a first mask pattern is removed and a second mask pattern is formed to expose a source zone in an nDMOS transistor area, an NMOS transistor area, and a drain zone in a pDMOS transistor area.

FIG. 4 shows a cross-sectional view of an example of a semiconductor substrate in which a first mask pattern is removed and a second mask pattern is formed to expose a source zone in an nDMOS transistor area, an NMOS transistor area, and a drain zone in a pDMOS transistor area. In the example of FIG. 4, the first mask pattern 314 is removed through an ashing and/or cleaning process according to a conventional method. Furthermore, a second mask pattern 414 is formed using a conventional photolithography process to cover the drain zone in the nDMOS transistor area, the PMOS transistor area, a portion of the separation region 112, which separates the NMOS transistor area from the pDMOS transistor area, and the source zone in the pDMOS transistor area, as illustrated. Once the second mask pattern 414 is formed on the semiconductor substrate 100, the source zone in the nDMOS transistor area, a first portion of the nDMOS gate electrode 217 adjacent the source zone in the nDMOS transistor area, the NMOS transistor area, the NMOS gate electrode 237 in the NMOS transistor area, the drain zone in the pDMOS transistor area, and a first portion of the pDMOS gate electrode 247 adjacent the drain zone in the pDMOS transistor area are exposed, accordingly.

In the example of FIG. 4, after the second mask pattern 414 is formed, an ion implantation process is performed to form p-type well (PWELL) regions 425, 427, and 429 in the source zone in the nDMOS transistor area, the NMOS transistor area, and the drain zone in the pDMOS transistor area, respectively. In the nDMOS transistor area and the pDMOS transistor area, the ion implantation process is performed such that the PWELL regions 425 and 429 abut the NWELL regions 325 and 329 below the nDMOS gate electrode 217 and the pDMOS gate electrode 247, respectively. Furthermore, in the example of FIG. 4, the ion implantation process is performed to be incident through the first portion of the nDMOS gate electrode 217 adjacent to the source zone in the nDMOS transistor area, the NMOS gate electrode 237 in the NMOS transistor area, and the first portion of the pDMOS gate electrode 247 adjacent to the drain zone in the pDMOS transistor area as well as the surface of the semiconductor substrate 100 in each exposed area. As illustrated in FIG. 4, the PWELL regions 425, 427, and 429 in the form of a retrograde well is formed deeper than the separation regions 112 or the high concentration source/drain regions, which are formed in the subsequent process, by high-energy and medium-energy ion implantation. For example, the PWELL region 425 is formed deeper than the high concentration source region. As another example, the PWELL region 429 is formed to be deeper than the trench type drain insulating film, which is the separation region 112 below the pDMOS gate electrode 247, and the high concentration drain region.

Since the ion implantation process is performed through the at least partially exposed gate electrodes, in the example of FIG. 4, the formed PWELL regions 425, 427, and 429 are shallower below the respective gate electrodes 217, 237, and 247 than below the separation regions 112 or the high concentration source/drain regions, which are formed in the subsequent process. For example, the PWELL regions 425 and 429, which are formed to overlap with the first portion of the nDMOS gate electrode 217 and the first portion of the pDMOS gate electrode 247, respectively, are shallower below the nDMOS gate electrode 217 and the pDMOS gate electrode 247 than below the high concentration source region and the high concentration drain region, respectively. This configuration occurs because the ion implantation depth is reduced by the exposed first portion of the nDMOS gate electrode 217 and the exposed first portion of the pDMOS gate electrode 247, which serve as masks. Thus, the PWELL region 425 formed in the nDMOS transistor area and the PWELL region 429 formed in the pDMOS transistor area serve as a p-body region in the nDMOS transistor and a drift region in the pDMOS transistor, respectively.

In such an example, after performing the ion implantation for forming the PWELL regions 425, 427, and 429, p-type ion implantation is performed to form an NMOS threshold voltage (Vt) adjustment area at an upper portion of the PWELL region 427, adjacent to the NMOS gate electrode 237. For example, the NMOS threshold voltage (Vt) adjustment area is formed at the surface of the semiconductor substrate 100 below the gate insulating film 215. Because the p-type threshold voltage adjustment area and the PWELL region 427 are formed of a material of the same conductivity type, the p-type ion implantation for threshold voltage adjustment is able to be performed immediately after the ion implantation for forming the PWELL regions 425, 427, and 429. In this example, because the ion implantation for forming the NMOS threshold voltage (Vt) adjustment area is to be performed through the NMOS gate electrode 237, an ion implantation energy level is required to be controlled in consideration of a thickness of the NMOS gate electrode 237. In the present example, the ion implantation energy level is set higher than in the case in which ion implantation is performed in the absence of the NMOS gate electrode 237.

Subsequently, in the example of FIG. 4, n-type lightly doped drain (NLDD) ion implantation is performed using n-type dopants to form NLDD regions 418 and 419 in the PWELL region 427 in the NMOS transistor area and the PWELL region 425 in the nDMOS transistor area, respectively. A pair of NLDD regions 418 is formed in the semiconductor substrate 100 that is exposed on both sides of the NMOS gate electrode 237. In an example, tilted ion implantation is performed using p-type dopants to form a p-type Halo region or pocket region located near the NLDD region 418. For example, ion implantation is carried out into the peripheries of the NLDD region 418 using the tilted ion implantation approach. As described above, the p-type Halo region is required to prevent punch-through in the source-drain region, that is, to prevent a channel region from disappearing as depletion regions at the source-drain region gradually extend and merge at their ends. As illustrated in the example of FIG. 4, the NLDD ion implantation possibly also allows n-type ion implantation to be made into a portion of the PWELL region 427 in the NMOS transistor area, where well tab regions are formed, and the PWELL region 429 in the pDMOS transistor area. Thus, n-type conductive regions 420 are formed in the corresponding portions below the surface of the semiconductor substrate 100.

While it has been described above that after one or more ion implantation processes are performed into the drain zone in the nDMOS transistor area, the PMOS transistor area, and the source zone in the pDMOS transistor area, one or more ion implantation processes are performed into the source zone in the nDMOS transistor area, the NMOS transistor area, and the drain zone in the pDMOS transistor area, it is to be appreciated that the above description is merely an example, and the processes are optionally carried out in the reverse order or in another appropriate different area. In addition, while it has been described above that after the ion implantation process for forming the NWELL region 327 or the PWELL region 427 in the PMOS transistor area or the NMOS transistor area, the threshold voltage (Vt) adjustment areas, the PLDD regions 318 or the NLDD region 418, and the Halo or pocket region are sequentially formed, it is to be appreciated that the scope of the disclosed examples is not to be limited by the above-described order of forming the regions.

Figure 5:
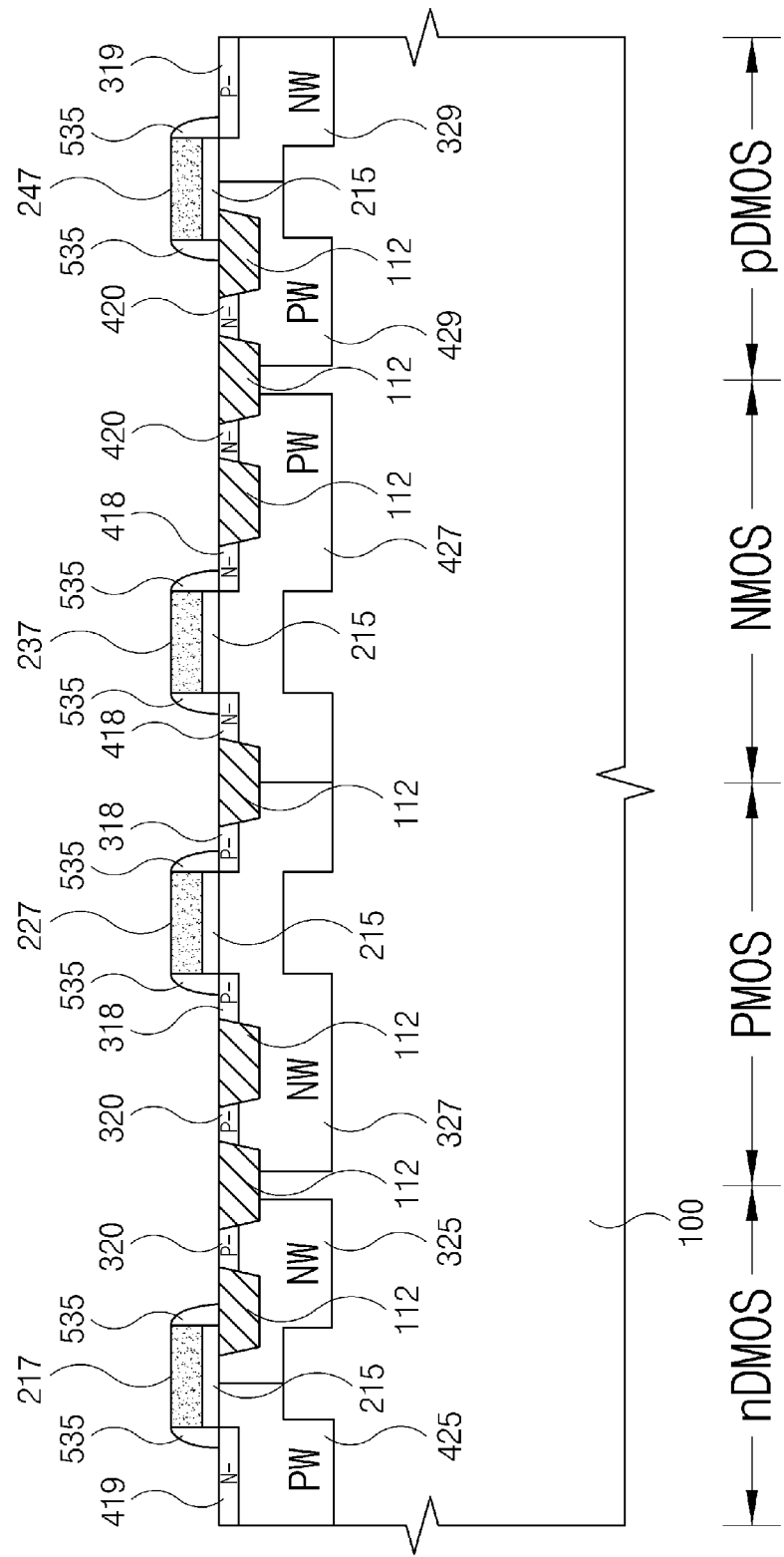
FIG. 5 shows a cross-sectional view of an example of a semiconductor substrate in which a second mask pattern is removed and sidewall spacers are formed at sidewalls of a stack consisting of a gate insulating film and a gate electrode in each transistor area.

FIG. 5 shows a cross-sectional view of an example of a semiconductor substrate in which a second mask pattern is removed and sidewall spacers are formed at sidewalls of a stack including a gate insulating film and a gate electrode in each transistor area. As is the case with the first mask pattern 314, the second mask pattern 414 is potentially removed through an ashing and/or cleaning process according to a conventional method. After the second mask pattern 414 is removed and before sidewall spacers 535 are formed, a rapid thermal annealing process is optionally performed at high temperature to facilitate diffusion of dopants injected by the ion implantation processes described in conjunction with the examples of FIGS. 3 and 4. In such an example, the sidewall spacers 535 consist of a two-layered film formed of a silicon oxide film and a nitride film or a three-layered film formed of an oxide film, a nitride film, and an oxide film, and are formed by an isotropic etch back process.

Figure 6:
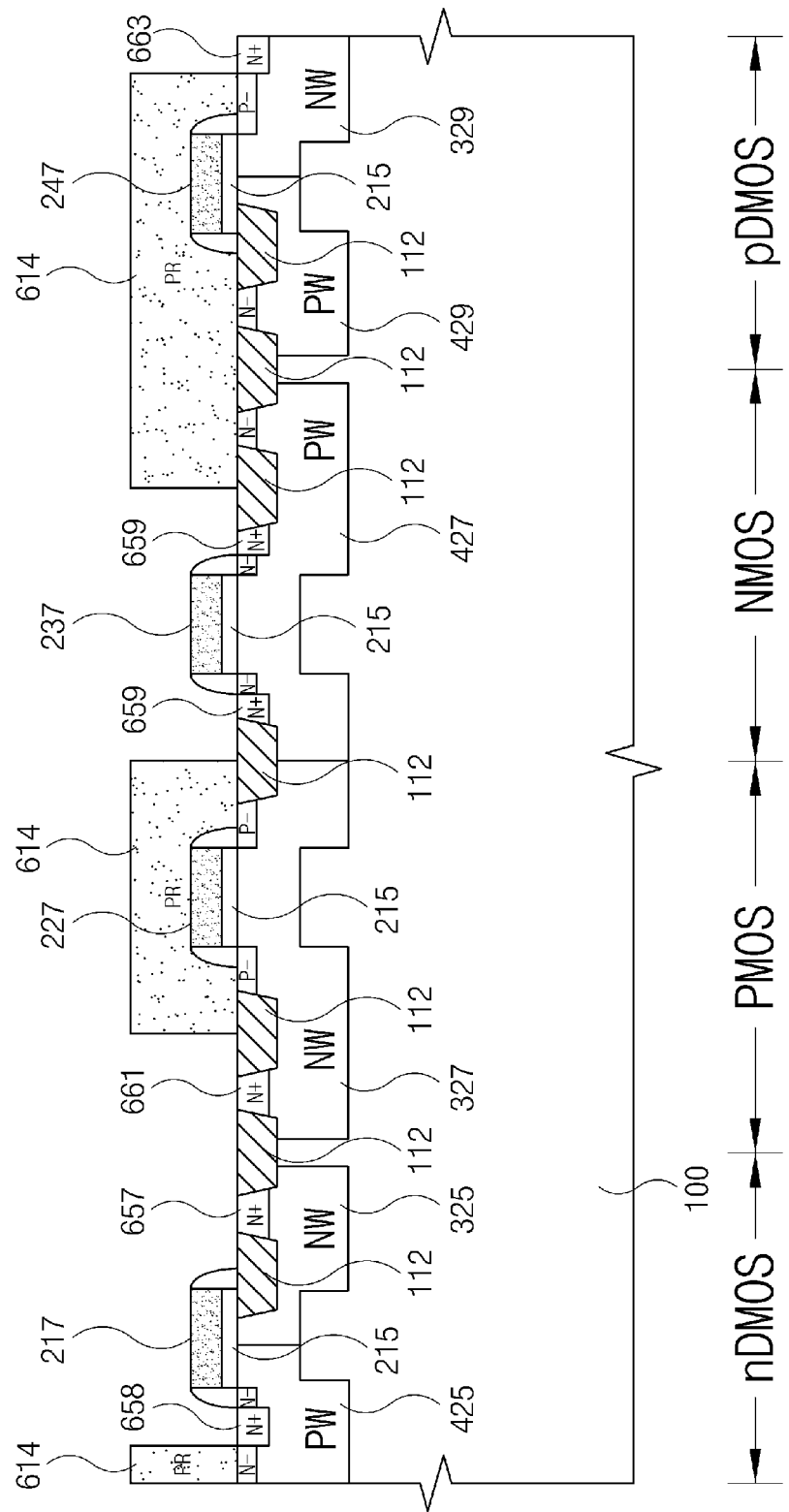
FIG. 6 shows a cross-sectional view of an example of a semiconductor substrate in which a third mask pattern is formed.

FIG. 6 shows a cross-sectional view of an example of a semiconductor substrate in which a third mask pattern is formed. In the example of FIG. 6, a third mask pattern 614 is formed using a conventional photolithography process to cover a portion in the nDMOS transistor area where a well tab region is formed, a portion other than a portion in the PMOS transistor area where a well tab region is formed, a portion in the NMOS transistor area where a well tab region is formed, and a portion other than a portion in the pDMOS transistor area where a well tab region is formed. Once the third mask pattern 614 is formed, an n-type ion implantation process is performed into the semiconductor substrate 100. For example, the ion implantation in this example includes ion implantation for forming a high concentration drain region 657 and a high concentration source region 658 in the NWELL region 325 and the PWELL region 425 in the nDMOS transistor area, respectively. Also, the ion implantation in this example further includes high concentration n-type ion implantation to form n-type source and drain (NSD) regions 659 below the NMOS gate electrode 237 and the gate insulating film 215 in the NMOS transistor area. For example, the high concentration n-type ion implantation is performed by utilizing the sidewall spacers 535 formed at both sidewalls of the NMOS gate electrode 237 as masks. The high concentration n-type ion implantation may be performed using one or more materials selected from arsenic and phosphorous. However, these are only examples, and it will be recognized that other appropriate dopants may be used in other examples. The ion implantation in this example optionally further includes ion implantation for forming a well tab region 661 in the PMOS transistor area. The ion implantation in this case optionally yet further includes ion implantation for forming a well tab region 663 in the pDMOS transistor area.

Figure 7:
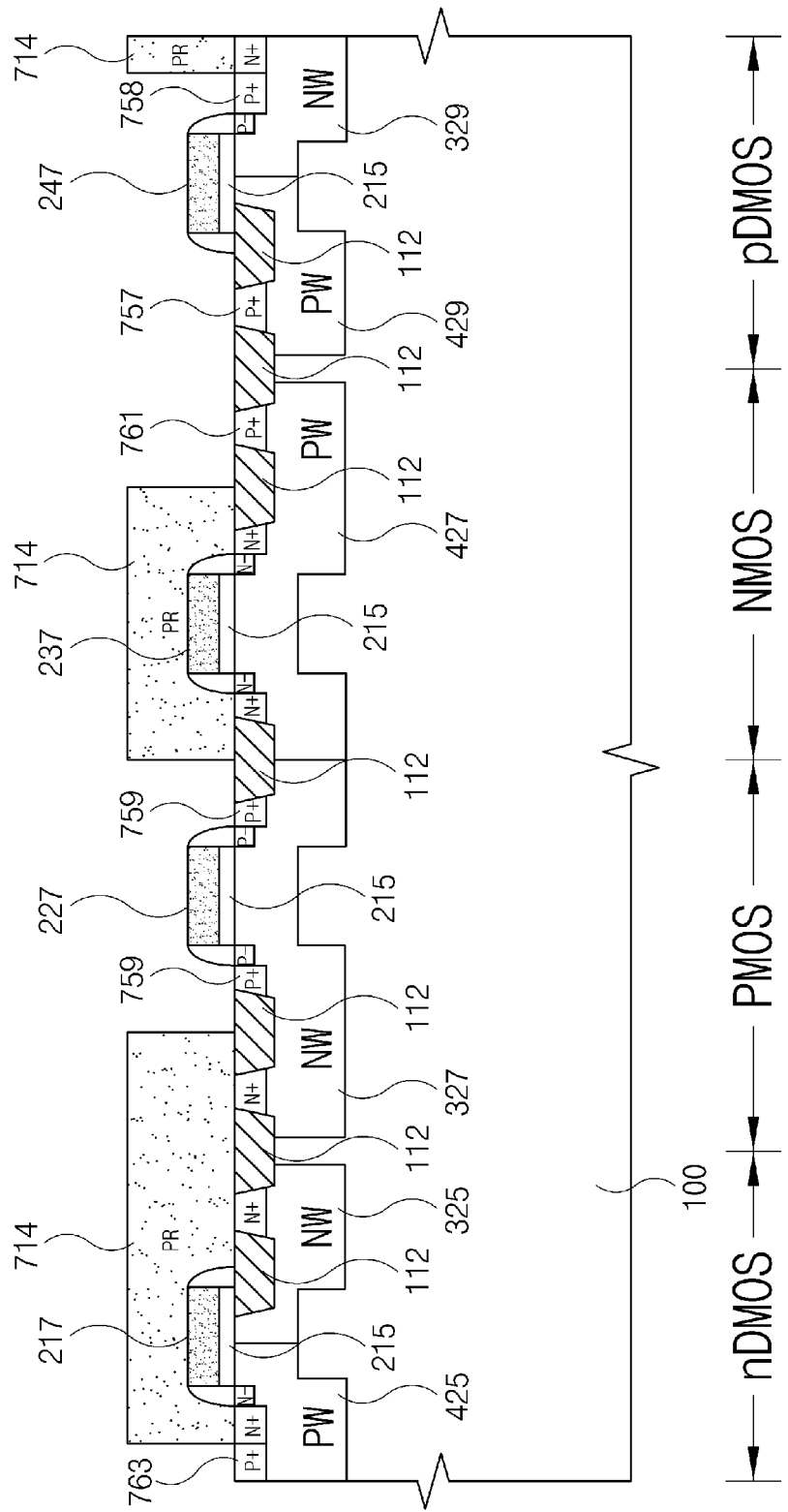
FIG. 7 shows a cross-sectional view of an example of a semiconductor substrate in which a third mask pattern is removed and a fourth mask pattern is formed.

FIG. 7 shows a cross-sectional view of an example of a semiconductor substrate in which a third mask pattern is removed and a fourth mask pattern is formed. In the example of FIG. 7, the third mask pattern 614 is removed through an ashing and/or cleaning process according to a conventional method. Also, in the example of FIG. 7, a fourth mask pattern 714 is formed using a conventional photolithography process to cover a portion other than a portion in the nDMOS transistor area where a well tab region is formed, a portion in the PMOS transistor area where a well tab region is formed, a portion other than a portion in the NMOS transistor area where a well tab region is formed, and a portion in the pDMOS transistor area where a well tab region is formed. Once the fourth mask pattern 714 is formed, a p-type ion implantation process is performed into the semiconductor substrate 100. For example, the ion implantation in this case includes ion implantation for forming a high concentration drain region 757 and a high concentration source region 758 in the PWELL region 429 and the NWELL region 329 in the pDMOS transistor area, respectively. The ion implantation in this example further includes high concentration p-type ion implantation to form p-type source and drain (PSD) regions 759 below the PMOS gate electrode 227 and the gate insulating film 215 in the PMOS transistor area. For example, the high concentration p-type ion implantation is performed by utilizing the sidewall spacers 535 formed at both sidewalls of the PMOS gate electrode 227 as masks. The high concentration p-type ion implantation may be performed using one or more materials selected from boron and boron trifluoride ($BF_2$). However, these are only example dopants and other appropriate dopants may be used for ion implantation. The ion implantation in this example optionally further includes ion implantation for forming a well tab region 761 in the NMOS transistor area. The ion implantation in this case optionally yet further includes ion implantation for forming a well tab region 763 in the nDMOS transistor area.

Figure 8:
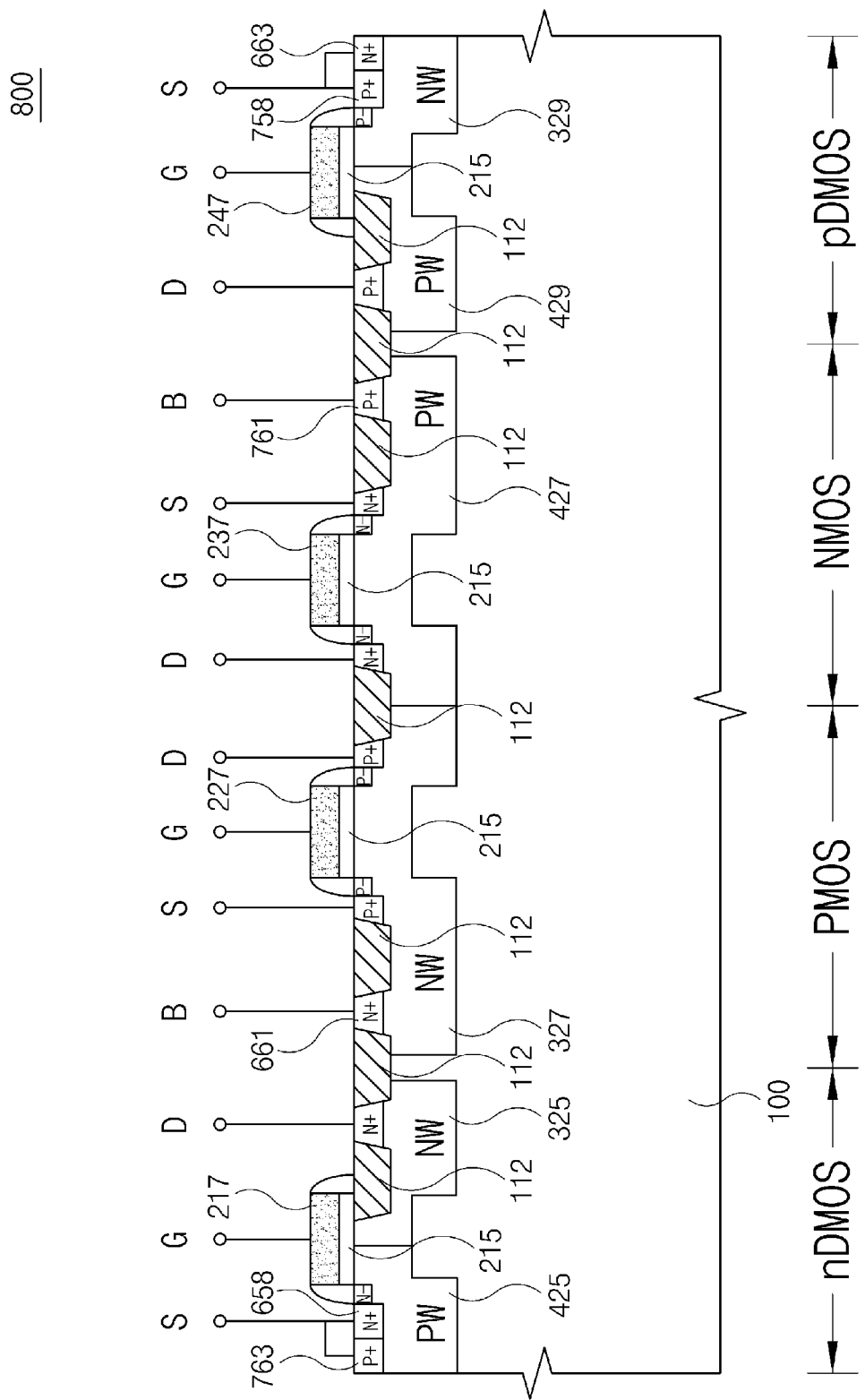
FIG. 8 shows a cross-sectional view of an example of a semiconductor device including an nDMOS transistor, a pDMOS transistor, and a CMOS transistor including a PMOS transistor and an NMOS transistor.

Upon completion of the above-described processes, the fourth mask pattern 714 is removed by an ashing and/or cleaning process, and a salicide process and back end processing such as forming contacts, metal layers, and pads are performed in the example of FIG. 7. Accordingly, a semiconductor device including the nDMOS transistor, the pDMOS transistor, and the CMOS transistor including the PMOS transistor and the NMOS transistor according to an example of the disclosed technology is completed as shown in the example of FIG. 8. By performing the salicide process, a salicide layer formed of materials such as cobalt (Co), nickel (Ni), and titanium (Ti) is laminated on the surface of the semiconductor substrate 100 and the gate electrodes 217, 227, 237, and 247. However, these are only example materials used in the salicide process, and other suitable materials may be used as well for the salicide process. It is known in the art that gate contact resistance is able to be reduced if a salicide layer is laminated on a gate electrode pattern. In addition, in the example of FIG. 8, a thermal process, such as a rapid thermal annealing process, is performed to activate injected ions in the source and drain regions. As illustrated, in a completed semiconductor device 800, an n-type lateral DMOS (nLDMOS) transistor is formed by connecting the well tab region 763 in the nDMOS transistor area to the high concentration source region 658 through contacts. In the same manner, a p-type lateral DMOS (pLDMOS) is formed by connecting the well tab region 663 in the pDMOS transistor area to the high concentration source region 758 through contacts.

As described above, according to the examples, the gate electrodes 217, 227, 237, and 247 are formed first in the semiconductor substrate 100. Because of the preformed gate electrodes 217, 227, 237, and 247, the ion implantation for forming the well regions 327 and 427, the ion implantation for forming the LDD regions 318 and 418, the channel ion implantation for forming the threshold voltage adjustment areas, and/or the ion implantation for forming the Halo region are able to proceed in succession without the use of any additional mask pattern in between these operations. In addition, at the time of performing ion implantation for forming the NWELL region 327 in the PMOS transistor area, the drift region 325 is simultaneously formed in the drain zone in the nDMOS transistor area, and the n-body region 329 is simultaneously formed in the source zone in the pDMOS transistor area. In addition, in the example of FIG. 8, at the time of performing ion implantation for forming the PWELL region 427 in the NMOS transistor area, the p-body region 425 is simultaneously formed in the source zone in the nDMOS transistor area, and the drift region 429 is simultaneously formed in the drain zone in the pDMOS transistor area. Therefore, according to the examples, the DMOS and CMOS transistors are formed together through a simplified BCD process employing a small number of mask patterns. According to the above-described examples, a total of four mask patterns are used until the ion implantation for forming the source and drain regions is finished. Furthermore, according to the example, the thermal budget is able to be reduced to improve a reverse short channel effect.

Figure 9:
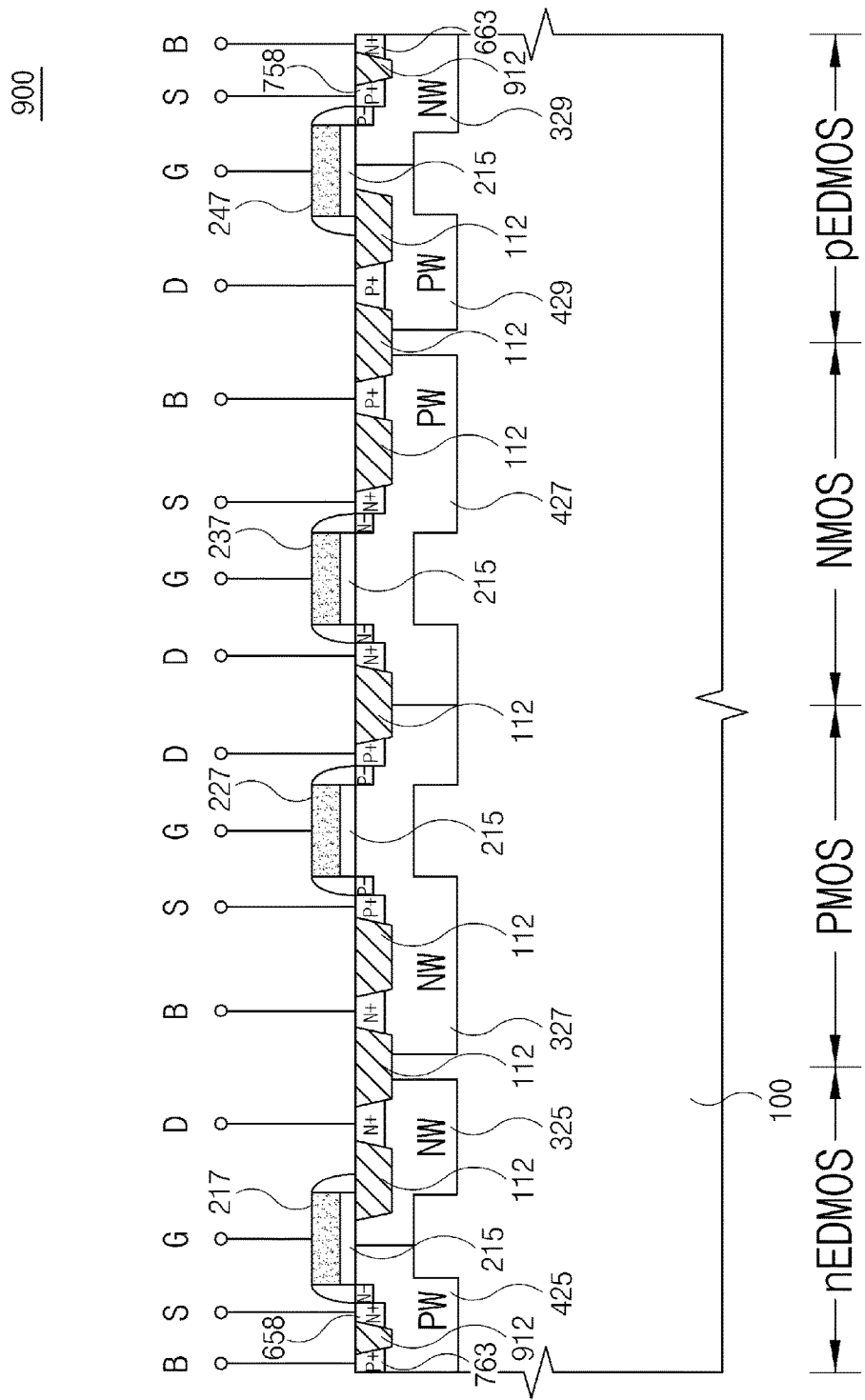
FIG. 9 shows a cross-sectional view of an example of a semiconductor device including an nEDMOS transistor, a pEDMOS transistor, and a CMOS transistor including a PMOS transistor and an NMOS transistor.

FIG. 9 shows a cross-sectional view of an example of a semiconductor device including an n-type extended drain DMOS (nEDMOS) transistor, a p-type extended drain DMOS (pEDMOS) transistor, and a CMOS transistor including a PMOS transistor and an NMOS transistor. The semiconductor device 900 shown in FIG. 9 includes EDMOS transistors instead of DMOS transistors. Thus, the EDMOS transistor in the semiconductor device 900 according to the example of FIG. 9 differs from the DMOS transistor in the semiconductor device 800 according to the example of FIG. 8 in that the well tab regions 763 and 663 and high concentration source regions 658 and 758 in the EDMOS transistors are separated by separation regions 912, and separate voltages are supplied to the well tab regions 763 and 663 and the high concentration source regions 658 and 758. In such an example, the separation region 912 is a source insulating film. Additionally, in such an example, the separation regions 912 is formed by the same process as the process for forming the separation regions 112. In an example, an nEDMOS transistor and a pEDMOS transistor are potentially formed using a reduced surface field (RE-SURF) method.

Figure 10:
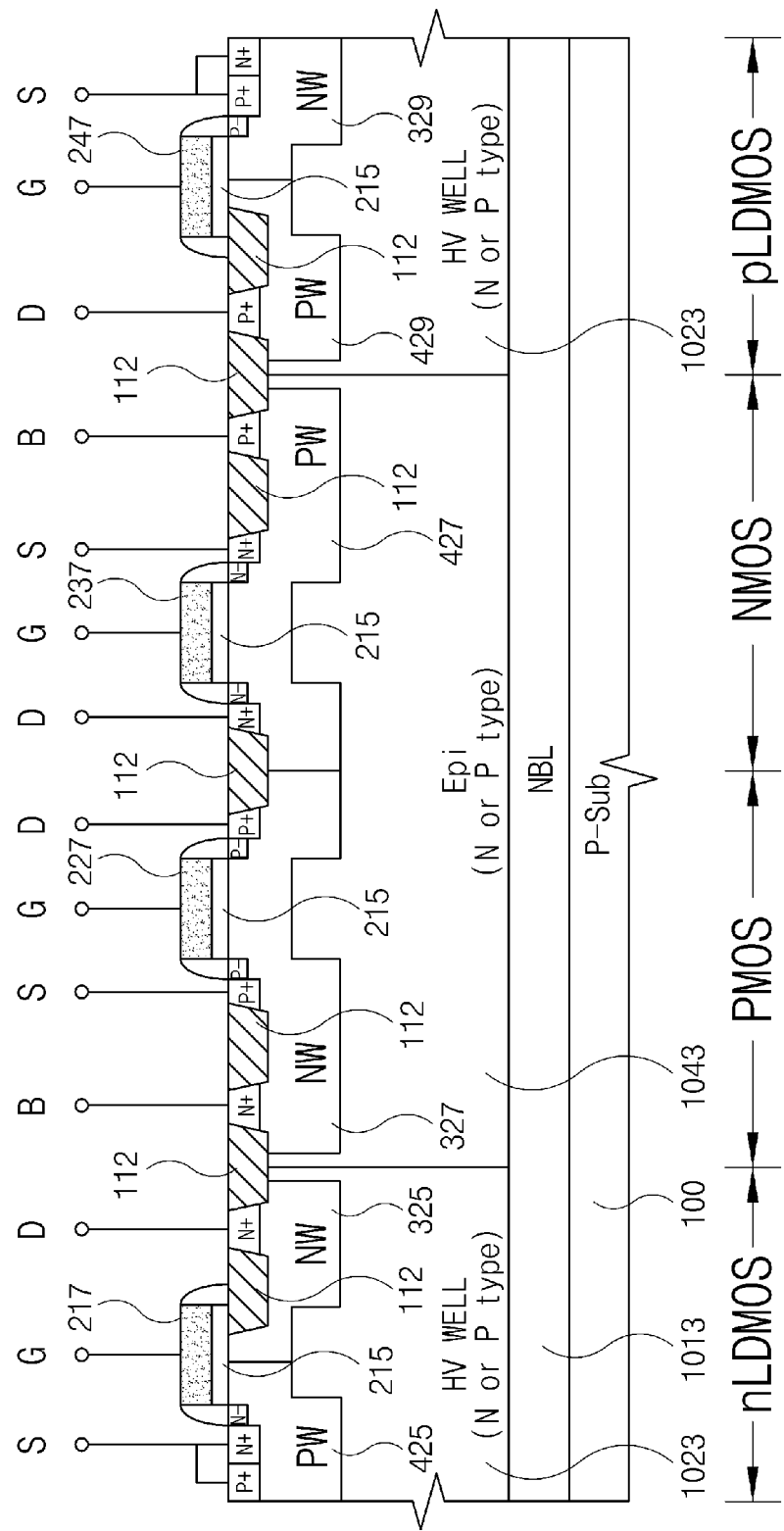
FIG. 10 shows a cross-sectional view of an example of a semiconductor device including an nLDMOS transistor, a pLDMOS transistor, and a CMOS transistor including a PMOS transistor and an NMOS transistor.

FIG. 10 shows a cross-sectional view of an example of a semiconductor device including an nLDMOS transistor, a pLDMOS transistor, and a CMOS transistor including a PMOS transistor and an NMOS transistor. The semiconductor device 1000 shown in FIG. 10 includes LDMOS transistors instead of DMOS transistors. The semiconductor device 1000 according to the example of FIG. 10 differs from the semiconductor device 800 according to the example of FIG. 8 in that substrate preprocessing for forming an n-type buried layer (NBL) 1013 in the semiconductor substrate 100, forming an epitaxial layer 1043 on the NBL 1013, and forming high voltage (HV) wells 1023 in partial areas of the epitaxial layer 1043 are performed to produce the semiconductor device 1000. As illustrated in the example of FIG. 10, the PMOS transistor and the NMOS transistor are formed in the epitaxial layer 1043, and the nLDMOS transistor and the pLDMOS transistor are respectively formed in the HV wells 1023. For example, the epitaxial layer 1043 and the HV wells 1023 are of an n-type material or a p-type material.

Figure 11:
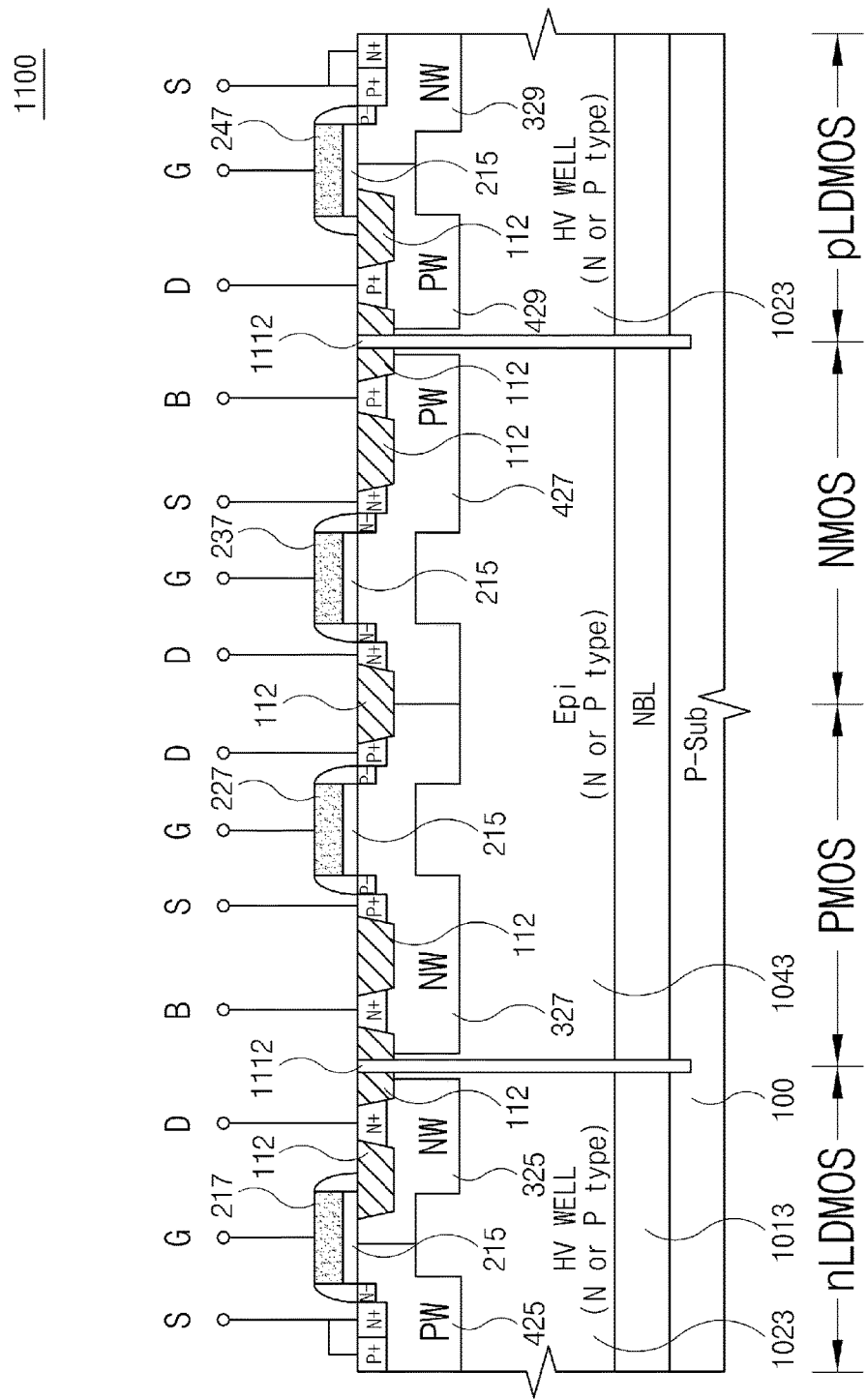
FIG. 11 shows a cross-sectional view of another example of a semiconductor device including an nLDMOS transistor, a pLDMOS transistor, and a CMOS transistor including a PMOS transistor and an NMOS transistor.

FIG. 11 shows a cross-sectional view of another example of a semiconductor device including an nLDMOS transistor, a pLDMOS transistor, and a CMOS transistor including a PMOS transistor and an NMOS transistor. The semiconductor device 1100 according to the example of FIG. 11 differs from the semiconductor device 1000 in that at least one device separation region 1112 for isolating the nLDMOS transistor, the CMOS transistor and the pLDMOS transistor from one another is formed in the semiconductor device 1100, as illustrated in FIG. 11. In such an example, the device separation region 1112 includes a deep trench isolation (DTI). Also, in such an example, the device separation region 1112 is formed to be deeper than the NBL 1013. In such an example, the device separation region 1112 is formed in the separation region 112 for isolating the nLDMOS transistor from the CMOS transistor and in the separation region 112 for isolating the CMOS transistor from the pLDMOS transistor.

It has been described above that the semiconductor device is formed to include the nDMOS transistor, the pDMOS transistor, and the CMOS transistor. However, it is to be appreciated that the semiconductor device is possibly embodied with only one of the nDMOS transistor and the pDMOS transistor and a single CMOS transistor. It is also to be appreciated that a single semiconductor device is possibly embodied with at least one nDMOS transistor and at least one pDMOS transistor, and a single semiconductor device is embodied with at least one DMOS transistor having the same conductivity type without departing from the spirit of the disclosed examples.

Figure 12:
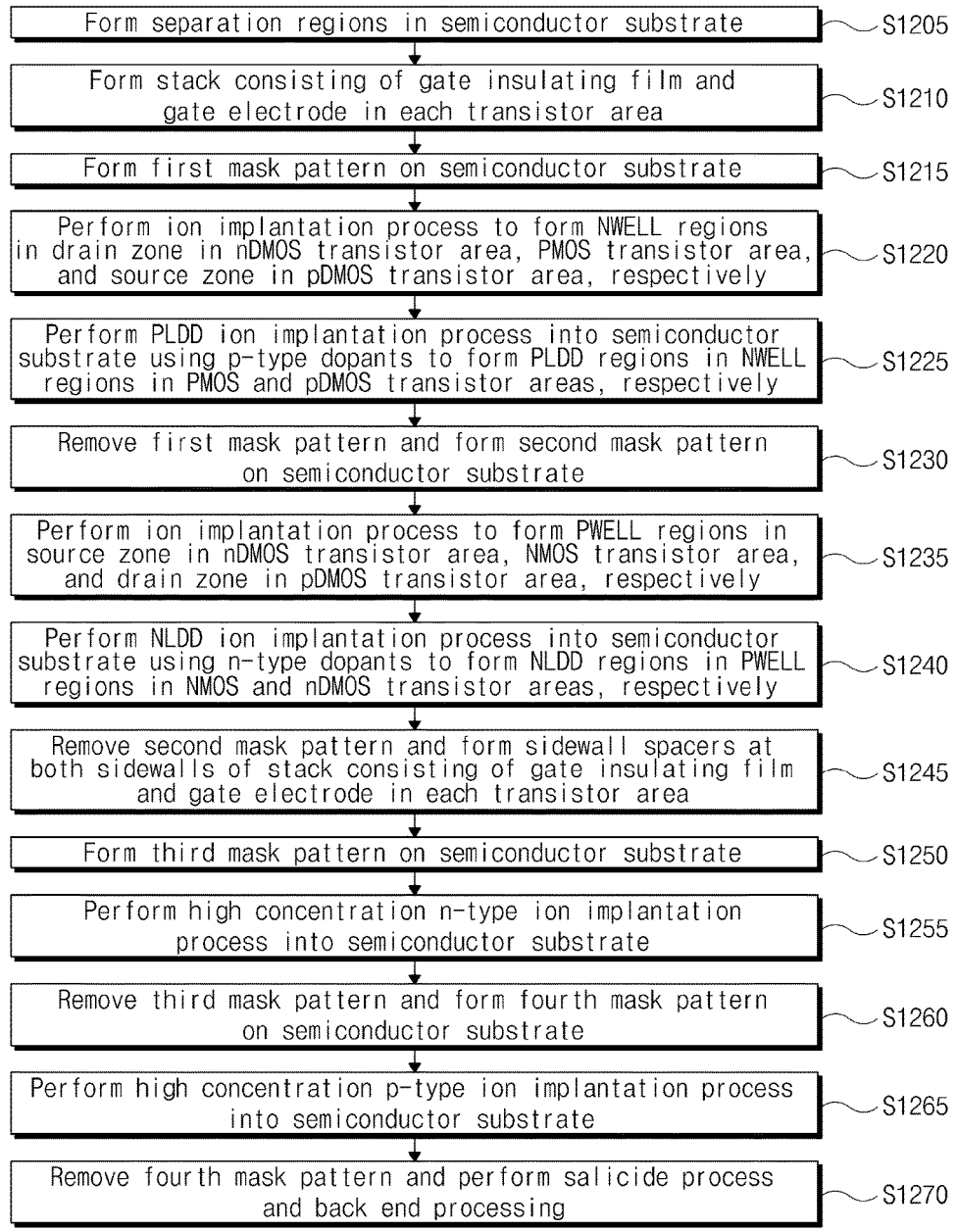
FIG. 12 shows a flowchart illustrating a method of fabricating a semiconductor device including a DMOS transistor and a CMOS transistor according to an example.

FIG. 12 shows an example of a flowchart illustrating a method of fabricating a semiconductor device including a DMOS transistor and a CMOS transistor according to an example.

The method of fabricating a semiconductor device according to an example of the disclosed technology begins at operation S1205 where the separation regions 112 for isolating the nDMOS transistor area, the PMOS transistor area, the NMOS transistor area, and the pDMOS transistor area are formed in the semiconductor substrate 100. In operation S1210, the stack consisting of the gate insulating film 215 and the gate electrode 217, 227, 237, or 247 is formed in each of the nDMOS transistor area, the PMOS transistor area, the NMOS transistor area, and the pDMOS transistor area. In operation S1215, the first mask pattern 314 is formed on the semiconductor substrate 100. In operation S1220, an ion implantation process is performed to form the NWELL regions 325, 327, and 329 in the drain zone in the nDMOS transistor area, the PMOS transistor area, and the source zone in the pDMOS transistor area, respectively. For example, the ion implantation in operation S1220 is performed through the second portion of the nDMOS gate electrode 217 adjacent to the drain zone in the nDMOS transistor area, the PMOS gate electrode 227 in the PMOS transistor area, and the second portion of the pDMOS gate electrode 247 adjacent to the source zone in the pDMOS transistor area as well as the surface of the semiconductor substrate 100 in each exposed area.

In operation S1225, a PLDD ion implantation process is performed into the semiconductor substrate 100 using p-type dopants to form the PLDD regions 318 and 319 in the NWELL region 327 in the PMOS transistor area and the NWELL region 329 in the pDMOS transistor area, respectively. In operation S1230, the first mask pattern 314 is removed, and the second mask pattern 414 is formed on the semiconductor substrate 100. In operation S1235, an ion implantation process is performed to form the PWELL regions 425, 427, and 429 in the source zone in the nDMOS transistor area, the NMOS transistor area, and the drain zone in the pDMOS transistor area, respectively. The ion implantation in operation S1235 may be performed through the first portion of the nDMOS gate electrode 217 adjacent to the source zone in the nDMOS transistor area, the NMOS gate electrode 237 in the NMOS transistor area, and the first portion of the pDMOS gate electrode 247 adjacent to the drain zone in the pDMOS transistor area as well as the surface of the semiconductor substrate 100 in each exposed area. In operation S1240, an NLDD ion implantation process is performed into the semiconductor substrate 100 using n-type dopants to form the NLDD regions 418 and 419 in the PWELL region 427 in the NMOS transistor area and the PWELL region 425 in the nDMOS transistor area, respectively.

In operation S1245, the second mask pattern 414 is removed, and the sidewall spacers 535 are formed at both sidewalls of the stack consisting of the gate insulating film 215 and the gate electrode 217, 227, 237, or 247 in each transistor area. In operation S1250, the third mask pattern 614 is formed on the semiconductor substrate 100. In operation S1255, an n-type ion implantation process is performed into the semiconductor substrate 100. This ion implantation is performed in order to form the high concentration drain region 657 and the high concentration source region 658 in the NWELL region 325 and the PWELL region 425 in the nDMOS transistor area, respectively, form the NSD 659 below the NMOS gate electrode 237 and the gate insulating film 215 in the NMOS transistor area, form the well tab region 661 in the PMOS transistor area, and form the well tab region 663 in the pDMOS transistor area. In operation S1260, the third mask pattern 614 is removed, and the fourth mask pattern 714 is formed on the semiconductor substrate 100. In operation S1265, a p-type ion implantation process is performed into the semiconductor substrate 100. This ion implantation is performed in order to form the high concentration drain region 757 and the high concentration source region 758 in the PWELL region 429 and the NWELL region 329 in the pDMOS transistor area, respectively, form the PSD 759 below the PMOS gate electrode 227 and the gate insulating film 215 in the PMOS transistor area, form the well tab region 761 in the NMOS transistor area, and form the well tab region 763 in the nDMOS transistor area. In operation S1270, the fourth mask pattern 714 is removed, and a salicide process and back end processing, such as forming contacts, metal layers, and pads, are performed to complete the semiconductor device including the nDMOS transistor, the pDMOS transistor, and the CMOS transistor including the PMOS transistor and the NMOS transistor.

Figure 13:
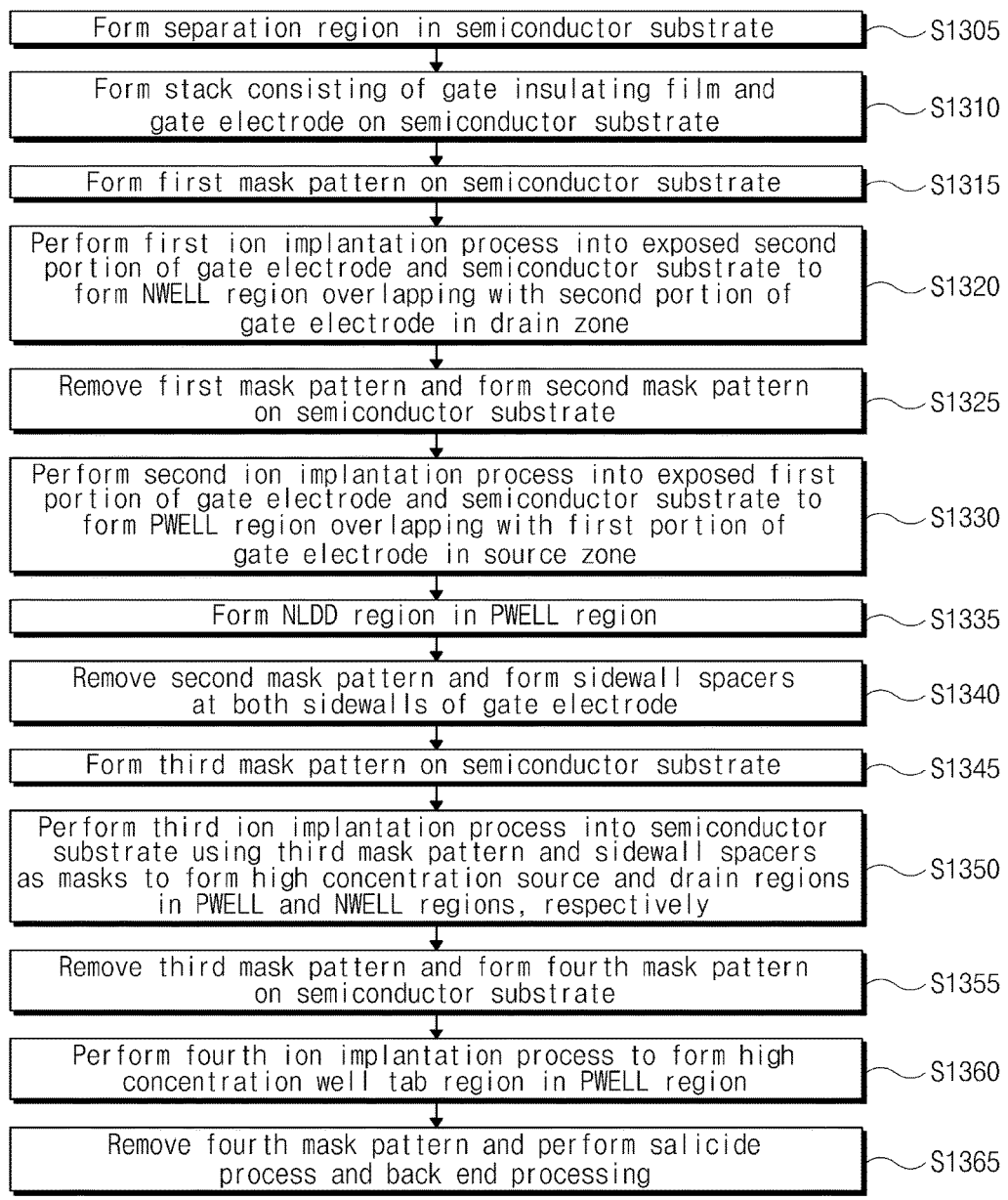
FIG. 13 shows a flowchart illustrating a method of forming a DMOS transistor according to an example.

FIG. 13 shows an example of a flowchart illustrating a method of forming a DMOS transistor according to an example.

The method of forming a DMOS transistor according to an example begins at operation S1305 in which the separation region 112 is formed in the semiconductor substrate 100. For example, the separation region 112 is formed in the semiconductor substrate 100 in at least a partially overlapping relationship with the gate electrode in the drain zone below the gate electrode, which is formed in the subsequent process. In such an example, the separation region 112 includes a trench type drain insulating film such as a field oxide film. Also, in an example, the separation region 112 further includes a source insulating film for isolating the well tab region from the high concentration source region. In operation S1310, the stack consisting of the gate insulating film 215 and the gate electrode 217 is formed on the semiconductor substrate 100. As described above, in an example, the gate insulating film 215 and the gate electrode 217 is formed on the drain insulating film in at least a partially overlapping relationship with the drain insulating film. In operation S1315, the first mask pattern 314 is formed on the semiconductor substrate 100. In such an example, the first mask pattern 314 is a mask pattern for masking the source zone and exposing the drain zone. In this example, it is to be noted that by performing the source zone masking, the first portion of the gate electrode 217 adjacent to the source zone is masked, and the second portion of the gate electrode 217 adjacent to the drain zone is exposed. In operation S1320, a first ion implantation process is performed into the exposed second portion of the gate electrode 217 and the semiconductor substrate 100 to form the NWELL region 325 that overlaps with the second portion of the gate electrode 217 in the drain zone. In operation S1325, the first mask pattern 314 is removed, and the second mask pattern 414 is formed on the semiconductor substrate 100. For example, the second mask pattern 414 is a mask pattern for masking the drain zone and exposing the source zone. In this case, it is to be noted that by performing the drain zone masking, the second portion of the gate electrode 217 adjacent to the drain zone is masked, and the first portion of the gate electrode 217 adjacent to the source zone is exposed. In operation S1330, a second ion implantation process is performed into the exposed first portion of the gate electrode 217 and the semiconductor substrate 100 to form the PWELL region 425 that overlaps with the first portion of the gate electrode 217 in the source zone. In operation S1335, the NLDD region 419 is formed in the PWELL region 425.

In operation S1340, the second mask pattern 414 is removed, and the sidewall spacers are formed at both sidewalls of the gate electrode 217. In operation S1345, the third mask pattern 614 is formed on the semiconductor substrate 100. For example, the third mask pattern 614 is a mask pattern that covers a portion in the PWELL region 425 where a well tab region is formed. In operation S1350, a third ion implantation process is performed into the semiconductor substrate 100 using the third mask pattern 614 that was formed in operation S1345 and the sidewall spacers that were formed in operation S1340 as masks to form the high concentration source region and the high concentration drain region in the PWELL region 425 and the NWELL region 325, respectively. In operation S1355, the third mask pattern 614 is removed, and the fourth mask pattern 714 is formed on the semiconductor substrate 100. For example, the fourth mask pattern 714 is a mask pattern that covers a portion in the source zone other than a portion where a well tab region will be formed and the drain zone. In operation S1360, a fourth ion implantation process is performed to form the high concentration well tab region in the PWELL region 425. In operation S1365, the fourth mask pattern 714 is removed, and a salicide process and back end processing such as forming contacts, metal layers, and pads are performed to complete the DMOS transistor.

According to examples, it is possible to integrate DMOS and CMOS transistors into a single IC chip using a simplified manufacturing process. Examples also make it possible to simplify the DMOS transistor manufacturing process, reduce the manufacturing costs, and shorten the manufacturing period.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a semiconductor substrate;
a gate insulating film formed on the substrate;
a gate electrode formed on the gate insulating film;

a first well region and a second well region formed in the substrate, wherein the first well region and the second well region are in direct contact with each other, and an interface between the first well region and the second well region is disposed below the gate electrode; and a high concentration drain region formed in the first well region; and a high concentration source region formed in the second well region, wherein the first well region is formed to be deeper than the high concentration drain region and is formed to be shallower below the gate electrode than below the high concentration drain region, and wherein the second well region is formed to be deeper than the high concentration source region and is formed to be shallower below the gate electrode than below the high concentration source region.

2. The semiconductor device of claim 1, further comprising a field oxide region formed overlapped with the gate electrode and is formed in the first well region.

3. The semiconductor device of claim 1, wherein the semiconductor device comprises a diffused metal-oxide-semiconductor (DMOS) transistor.

4. The semiconductor device of claim 1, further comprising:
   an buried layer formed in the semiconductor substrate;
   a deep trench isolation (DTI) formed deeper than the buried layer; and
   a well tab region in the second well region.

5. A semiconductor device, comprising:
   a gate insulating film formed in a semiconductor substrate;
   a gate electrode formed on the gate insulating film;
   a first well region formed overlapping at least in part with a first portion of the gate electrode;
   a second well region formed overlapping at least in part with a second portion of the gate electrode; and
   an high concentration source region formed in the second well region; and
   an high concentration drain region formed in the first well region,
   wherein the first well region is formed deeper than the high concentration drain region and is formed shallower below the gate electrode than below the high concentration drain region, and
   wherein the second well region is formed deeper than the high concentration source region and is formed shallower below the gate electrode than below the high concentration source region.

6. The semiconductor device of claim 5, further comprising a field oxide region formed overlapped with the gate electrode and is formed in the first well region.

7. The semiconductor device of claim 5, wherein the semiconductor device comprises a diffused metal-oxide-semiconductor (DMOS) transistor.

8. The semiconductor device of claim 5, further comprising:
   an buried layer formed in the semiconductor substrate;
   a deep trench isolation (DTI) formed deeper than the buried layer; and
   a well tab region in the second well region.

* * * * *